(12) United States Patent
Shimokawa et al.

(10) Patent No.: US 6,571,007 B1
(45) Date of Patent: May 27, 2003

(54) BALL-ARRANGING SUBSTRATE FOR FORMING BUMP, BALL-ARRANGING HEAD, BALL-ARRANGING DEVICE, AND BALL-ARRANGING METHOD

(75) Inventors: Kenji Shimokawa, Kawasaki (JP); Eiji Hashino, Kawasaki (JP); Kohei Tatsumi, Kawasaki (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/355,517

(22) PCT Filed: Aug. 28, 1997

(86) PCT No.: PCT/JP97/03011

§ 371 (c)(1),
(2), (4) Date: Jul. 29, 1999

(87) PCT Pub. No.: WO98/34273

PCT Pub. Date: Aug. 6, 1998

(30) Foreign Application Priority Data

Jan. 30, 1997 (JP) .............................. 9-031274
Apr. 8, 1997 (JP) .............................. 9-105309

(51) Int. Cl.$^7$ ................................. G06K 9/00
(52) U.S. Cl. ............... 382/147; 348/95; 250/559.34
(58) Field of Search .......................... 382/146, 147, 382/151, 145, 294, 197; 348/87, 94, 95, 126; 438/612, 613, 615, 616; 324/758, 765, 754, 755; 250/559.29, 559.3, 559.34, 559.37; 356/237.4

(56) References Cited

U.S. PATENT DOCUMENTS 5,694,482 A * 12/1997 Maali et al. ................. 382/151
5,741,410 A * 4/1998 Tsurushima ................. 228/44.7

FOREIGN PATENT DOCUMENTS

JP 6-331328 12/1994
JP 7-153766 6/1995
JP 8-285530 11/1996

OTHER PUBLICATIONS

Motorola Technical Development, vol. 24, Mar., 1995, p. 148.

* cited by examiner

Primary Examiner—Jayanti K. Patel
Assistant Examiner—Sheela Chawan
(74) Attorney, Agent, or Firm—Kenyon & Kenyon

(57) ABSTRACT

A ball-arranging substrate comprising a substrate with a main surface, a plurality of ball-arranging holes formed on the main surface for sucking and holding minute electroconductive balls at the locations corresponding to those of electrodes formed on a semiconductor device or a printed circuit board, wherein when light illuminates the ball-arranging surface to allow optical recognition of the arrangement of the minute electroconductive balls by means of the light reflected by the minute electroconductive balls and by the main surface, the wave length of the light of the light source is set in the range of 300 to 900 nm, and the reflectivity is made not more than 50% based on the light source. A reflective mirror should be provided on the rear surface of the substrate opposite to the light source, in the case when the substrate is transparent to the irradiated light.

17 Claims, 10 Drawing Sheets

BALL-ARRANGING SUBSTRATE FOR FORMING BUMP, BALL-ARRANGING HEAD, BALL-ARRANGING DEVICE, AND BALL-ARRANGING METHOD

BACKGROUND OF THE INVENTION

1. Field of the Invention

The present invention relates to a substrate, a head, an apparatus and a method each for arranging a plurality of minute electroconductive balls, which are bonded to form bumps on the electrodes of a semiconductor element, printed circuit board (PCB), etc., wherein a means for recognizing whether or not balls are held is provided.

2. Description of the Related Art

In the ball bump process which is applied in producing a semiconductor device, bumps are formed of minute electroconductive balls on the electrode portion (pad) of a semiconductor device or a PCB, and these devices and PCBs are bonded via the bumps with each other. In such a process, a ball-arranging substrate is used, in which minute electroconductive ball-arranging holes are formed, corresponding to the location of electrodes of the semiconductor device or a PCB.

In the process for forming bumps, the minute electroconductive balls are sucked and held in the ball-arranging through holes of the ball-arranging substrate by means of vacuum suction, etc. It is necessary that a single ball is exactly sucked in a single hole of the ball-arranging substrate. If a ball is not sucked, then a bump is not formed on the electrode, and if two or more balls are sucked in a single ball-arranging hole, the bump may contact the adjacent pad.

As a method for recognizing such a ball-sucking failure, it is known to irradiate a laser beam from the lateral and the rear sides of the ball-arranging substrate. If an error is recognized, the error is removed by removing excess minute balls or repeating such a ball-suction. When it is recognized that the balls are arranged on the substrate without an error, the ball-arranging substrate with the balls as be are transported to a bump-bonding stage, where the locations of the minute electroconductive balls of the substrate and the electrode pads of a semiconductor device are aligned with each other.

After the completion of the alignment, the ball-arranging substrate, on which the minute electroconductive balls are sucked, is lowered down on the semiconductor device, and then the minute electroconductive balls and the electrode pads are bonded with each other by means of heat pressing. In the case when bumps are formed of a low melting point metal at the electrode portions of a PCB, it is general that a flux is applied to the electrode portions, and minute balls are arranged at the electrode portions and then reflowed.

As set forth above, the prior art inspection for excess balls or lack of sucked balls includes a method for inspecting excess balls or lack of balls by irradiating light from the front or lateral side of the ball-arranging substrate. If there is lack of a ball, the light irradiated from the front side of the substrate reaches, through the open ball-arranging hole, the light-receiver located on the rear side of the ball-arranging substrate, so that lack of a ball can be detected. If there are excess balls, the light irradiated from the lateral side of the substrate is shut out, and thus the light does not reach the light-receiver located on the opposite side of the ball-arranging substrate, so that excess balls can be detected. However, this method of inspection does not have reproducibility in recognizing defects of the balls and is not used, in industrial production, when the diameter of the balls is less than 300 μm, particularly less than 200 μm, because the amount of light and the accuracy of the location recognition are not sufficient.

On the other hand, another method using the image-recognization method is known for inspecting the arranged balls. According to the method, the light is irradiated to the minute balls, which are held on the ball-arranging substrate, and the reflected light is inspected by a CCD camera. The reflected light is converted to binary images, i.e., the light reflected by the balls is converted to white image, and the light reflected by the substrate is converted to black image. Thus, the ball-arranging condition is recognized.

However, it has been considered that it was difficult to exactly recognize the minute balls sucked and held-on the ball-arranging substrate by the image recognizing method and this method was not applied in the industry. For example, in the case when the ball-arranging substrate is made up of a metal, e.g. stainless steel, the light reflected at the substrate itself causes erroneous recognition e.g. due to reflections from machinery defect and damage portions or due to insufficient intensity difference between the light reflected by the minute balls and that reflected by the ball-arranging substrate itself causing an insufficient contrast. Also burrs may be formed on the substrate, when metal working, e.g., mechanical working, electrodischarging and laser irradiation is applied. In such a case, the accuracy was remarkably influenced when the minute balls, whose diameter was less than 200 μm, were mounted on the chip, etc.

Furthermore, when the substrate used is made of glass, the irradiated light is transmitted through the glass and reaches the jig, which holds the glass substrate, and the light reflected by the jig causes errors in recognition of the balls as a metal arranging substrate does. That is, the transmitted light is irregularly reflected near the ball sucking hole to provide white bright images, causing the recognition of sucked balls to be uncertain. And the light is reflected by the defects scattered on the surface of the substrate, where the reflected light also gives white images. Such a reflected light may be erroneously recognized to be caused by the sucked minute balls.

The object of the present invention is to provide a ball arranging substrate, arranging head, arranging apparatus and arranging method, in which the conditions of sucked balls more precisely than before, by which ball bumps can be formed more exactly.

For example, as disclosed in Japanese Unexamined Patent Publication No. 4-250643, a conventional ball-arranging substrate is produced by forming ball-arranging holes on the substrate of a metal, e.g., stainless steel or a ceramic material, etc. by means of precise electrodischarging, laser-irradiation, electroforming, etching, etc.

When the ball-arranging substrate is a metal, e.g., stainless steel, misalignment is caused by thermal expansion of the arranging substrate during aligning between the ball-arranging holes and the electrodes due to a large difference in the thermal expansion coefficient between a metal substrate and silicon chip. When the ball-arranging holes are formed by means of laser irradiation or electrodischarging, a protuberance is formed around the holes and thus, dispersion of the height of sucked balls and a decrease in the sucking capability are observed. Furthermore, in the prior art it was difficult to precisely open the ball-arranging holes, of a diameter less than 100 μm, by means of a general purpose working apparatus. If the diameter of the ball-arranging holes must be less than 100 μm, the opened holes are narrowed by means of metal plating. However, the number of working processes is increased and the diameter of the opened holes is not formed uniformly, and the shapes of the holes are not formed as true circles. Thus, these defects result in misplacement of the arranged balls, and when bumps formed on a semiconductor device, or innerlead of TAB, or a printed circuit board, etc. are arranged at a narrow pitch, the precision of the ball arrangement is lowered.

Japanese Unexamined Patent Publication No. 7-95554, discloses a ball-arranging glass substrate. However, the disclosed substrate is not suitable for arranging minute electroconductive balls.

Another object of the present invention is to provide a ball-arranging substrate, a ball-arranging head, and an apparatus for arranging balls and also a method for arranging balls, in which the minute balls are arranged more precisely than before, and thus ball-bumps. are formed more exactly.

DISCLOSURE OF THE INVENTION

In order to achieve the object set forth above, the present invention provides the following:

(1) A ball-arranging substrate comprising:

a substrate having a main surface; and a plurality of ball-arranging holes which are provided on said main surface at locations corresponding to those of the electrodes of a semiconductor device or a printed circuit board, etc., for sucking and holding minute electroconductive balls in said ball-arranging holes;

wherein when light illuminates the ball-arranging surface with said sucked minute electroconductive balls, to optically recognize the conditions of arrangement of said minute electroconductive balls by means of the light reflected by said minute electroconductive balls and by said ball-arranging surface, the wavelength of said light emitted by a light source is selected in the range of 300 to 900 nm, and the reflectivity of said ball-arranging substrate for light from said light source is not more than 50%, provided that a reflective mirror may be provided on the rear surface of said ball-arranging substrate opposite to said light source, in the case when said ball-arranging substrate is transparent to the irradiated light.

(2) A ball-arranging substrate according to said (1), wherein a anti-reflection film is formed on said ball-arranging surface on which said minute electroconductive balls to be sucked and held.

(3) A ball-arranging substrate according to (1) or (2), wherein said ball-arranging substrate is made of glass.

(4) A ball-arranging substrate according to (3), wherein said substrate is made of photosensitive glass.

(5) A ball-arranging substrate according to anyone of (1) to (4), wherein the ratio of the diameter of said ball-arranging holes on the side of minute electroconductive ball-arrangement to the diameter of said minute electroconductive balls is in the range of from 1/3 to 4/5; and, the thickness of said ball-arranging substrate is in the range of from 0.3 to 1.0 mm.

(6) A ball-arranging substrate according to (1) to (5), wherein the diameter of said minute electroconductive ball is in the range of 20 to 200 μm.

(7) A ball-arranging substrate according to (1) to (6), wherein said reflectivity of said ball-arranging substrate is not more than 30%.

(8) A minute electroconductive ball-arranging glass substrate comprising: a plurality of ball-arranging holes, the diameters of which are smaller than those of said minute electroconductive balls, for arranging said minute electroconductive balls at locations corresponding to those of the electrodes of a semiconductor device or a printed circuit board, wherein the ratio of the diameter of said ball-arranging holes to that of said minute electroconductive balls is in the range of from 1/3 to 4/5, the diameter of said ball-arranging holes being measured on the surface of said minute electroconductive ball-arranging glass substrate; and the thickness of said minute electroconductive ball-arranging glass substrate is in the range of from 0.3 to 1.0 mm.

(9) A minute electroconductive ball-arranging glass substrate according to (8), wherein said ball-arranging glass substrate is made of photosensitives glass.

(10) A minute electroconductive ball-arranging head, comprising:

a minute electroconductive ball-arranging substrate in accordance with (1) to (9); and, a means for holding minute electroconductive balls, provided with a vacuum space for sucking said minute electroconductive balls, on the other surface of said substrate opposite to the surface holding the minute electroconductive balls.

(11) A minute electroconductive ball-arranging apparatus comprising:

a minute electroconductive ball-arranging head in accordance with (10);

light sources for illuminating the electroconductive balls holding surface of said ball arranging substrate;

a light-receiver for receiving light reflected by said ball arranging substrate after being emitted from said light sources; and, an image-recognizing and treating means for recognizing the conditions of the arrangement of said minute electroconductive balls on said ball-arranging substrate, based on the output from said light-receiver, said image-recognizing and-treating means examining the conditions of arrangement of said electroconductive balls after said electroconductive balls are arranged on said ball-arranging substrate.

(12) A ball-arranging apparatus accordance with (11), wherein the arrangement of the electroconductive balls on said ball-arranging substrate is repeated again if the conditions of the arrangement of the electroconductive balls are found to be inappropriate as a result of said examination.

(13) A method for arranging balls comprising the steps of:

sucking and holding to arrange minute electroconductive balls on a surface of a minute electroconductive ball-arranging substrate, corresponding to the locations of the electrodes of a semiconductor device or a printed circuit board; and illuminating said surface, on which said minute electroconductive balls were sucked, and recognizing conditions of arrangement of said minute electroconductive balls using the light reflected by said minute electroconductive balls and that reflected by said minute electroconductive ball-arranging surface, wherein the wave length of a light source is set in a range of 300 to 900 nm, and the reflectivity of the light from said light source by the minute electroconductive ball-arranging surface, is made not more than 50%.

(14) A method for arranging minute electroconductive balls according to (13), wherein said ball-arranging substrate is in accordance with (1) to (9).

BEST MODE FOR CARRYING OUT THE INVENTION

At first, examples of the methods and apparatus for bonding ball-type bumps by means of the ball-arranging substrate according to the present invention will be described, although such examples are not intended to limit the invention (the methods and apparatus are detailed in Japanese Unexamined Patent Publication (Kokai) No. 7-153765).

Figure 1:
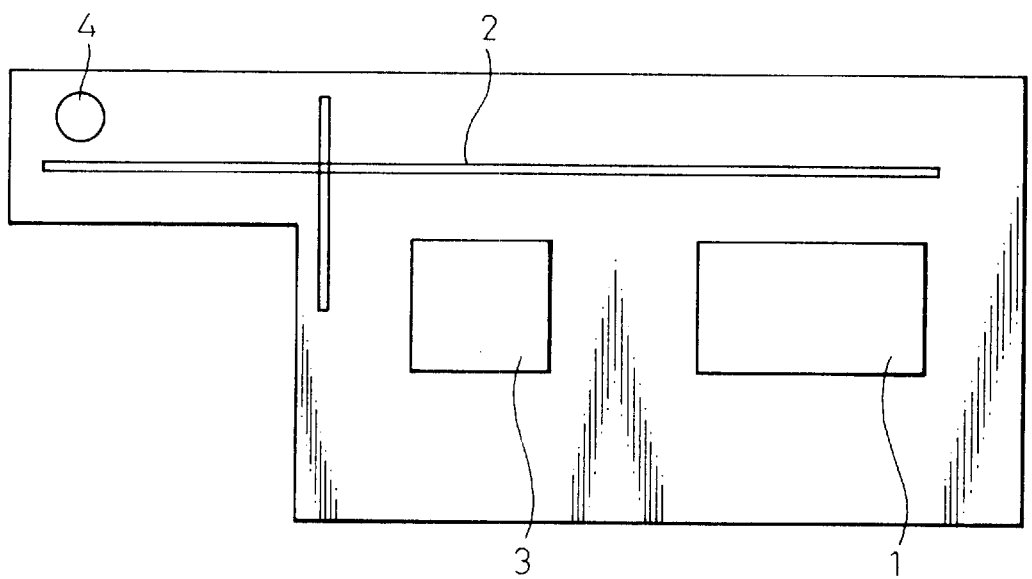
FIG. 1 is a schematic plan view of a ball-type bump bonding apparatus, in which its entire construction is illustrated.

As shown in FIG. 1, such an apparatus comprises, as the main constitution, a ball-arranging mechanism 1, a substrate-transporting mechanism 2, a ball-recognizing means 3 and a bonding stage 4. Such an apparatus may be constructed by adding a mechanism for arranging and bonding minute metallic balls to an apparatus comprising a bonding mechanism, e.g., an innerlead bonder.

Figure 2:
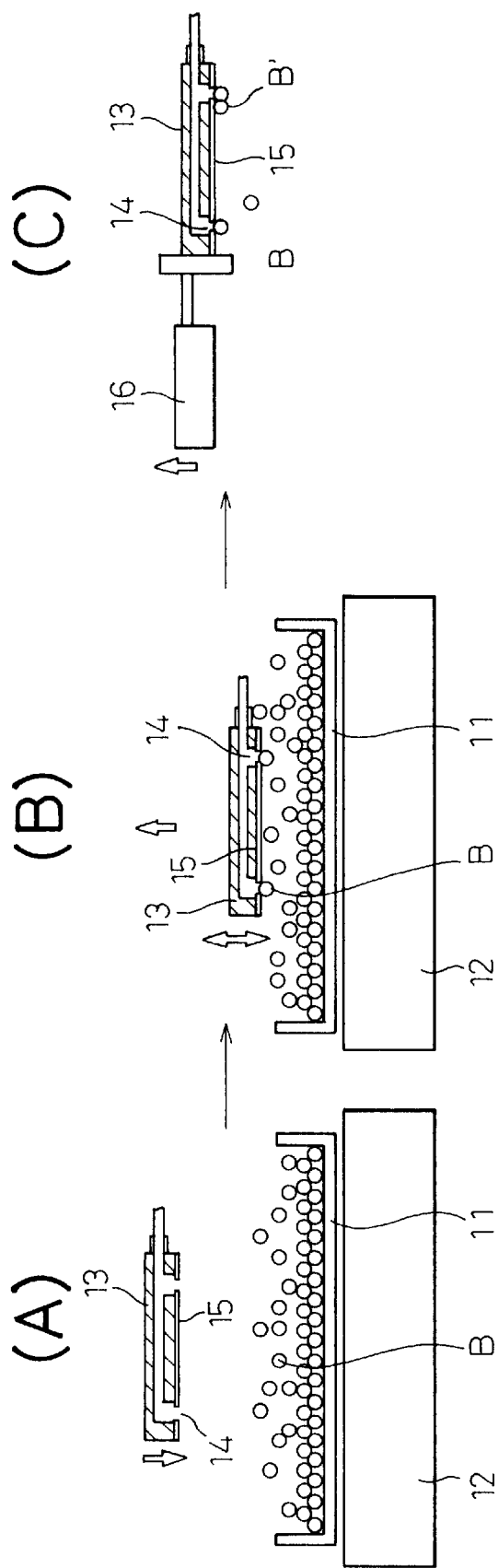
FIG. 2 is a schematic diagram for illustrating ball-arranging operation by means of a ball-arranging mechanism.

As shown in FIG. 2, a ball-stocking tray 11 is vibrated in the ball-arranging mechanism 1. Namely, minute metallic balls B are placed in a metallic ball-stocking tray 11, which is then vibrated by a vibrator 12, e.g., a parts-feeder in order to float the balls B effectively.

Then, the balls B are sucked to a ball sucking head 13, which comprises a ball-arranging substrate 15 provided with sucking through-holes 14, the diameters of which are smaller than that of the balls. It is preferable that the sucking through-holes 14 are provided for a plurality of semiconductor chips. The ball-sucking head 13 is lowered down near the ball-stocking tray 11 to suck balls B by vacuum suction into the ball-sucking through-holes 14 of the ball-arranging substrate 15. The lowering distance (a distance from the bottom of the tray to the arranging substrate) and the vibrating width of the ball-sucking head 13 can be controlled in the order of 0.1 mm.

Next, the ball-sucking head 13 is raised upwards, and the excess balls B', which are not the vacuum sucked balls B are mechanically removed and recovered. The ball-sucking heat 13 is slightly vibrated by means of a vibrator 16 so that only the excess balls B' are removed and the normally sucked balls are not removed.

Figure 3:
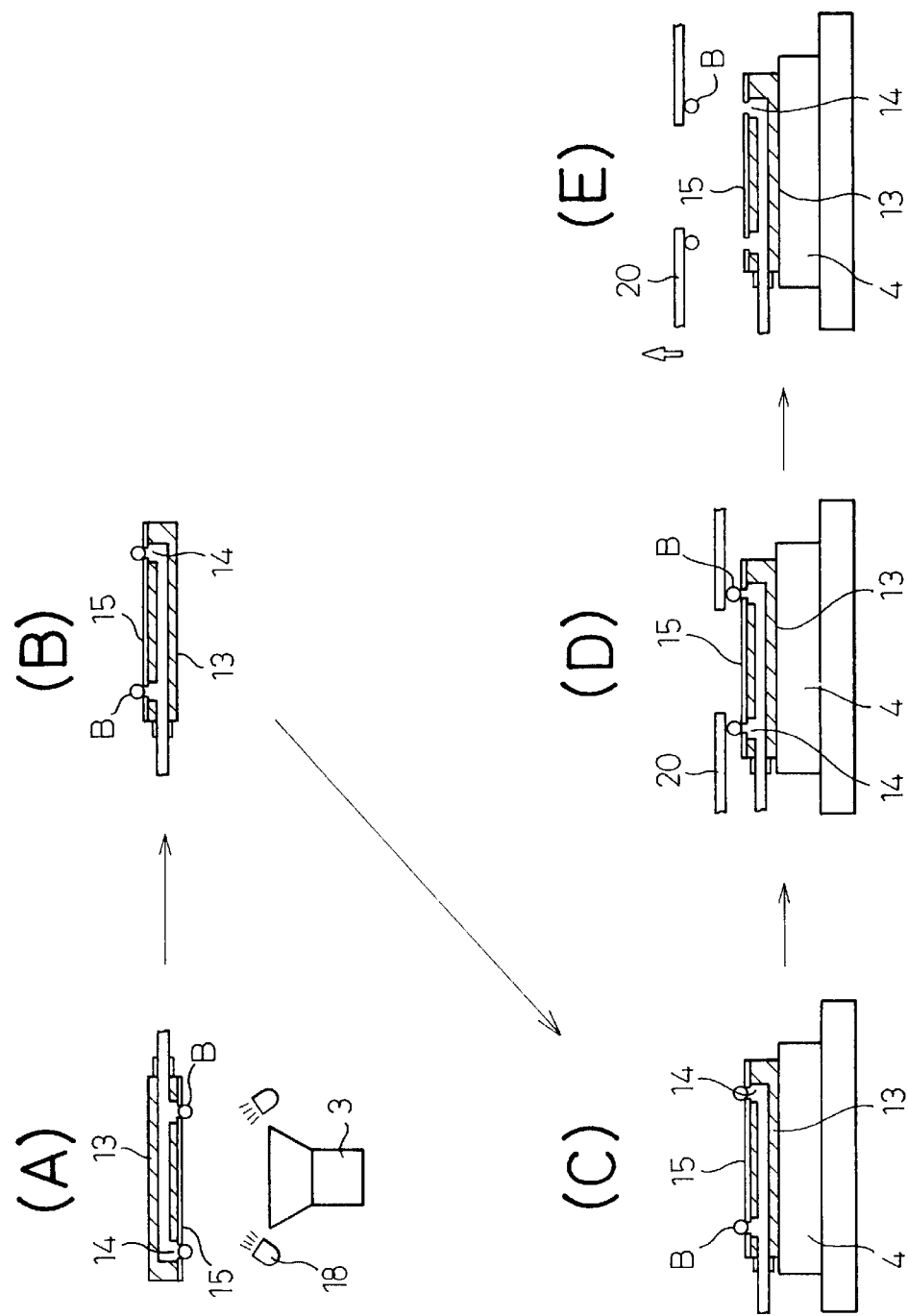
FIG. 3 is a schematic diagram for bonding balls to leads of a film-carrier.

As shown in FIG. 3, after the excess balls B' are removed, the ball-sucking head 13 is moved to a so-called recognizing location, where the ball-arranging substrate 15 is illuminated by light sources 18 located surrounding the ball-recognizing means 3, and the lacking of balls to be sucked and the existence of excess balls are recognized by means of a ball recognizing means, e.g., a CDD camera. If such failures are recognized, all of the sucked balls are recovered by means of vacuum leak and mechanical removal, and then the ball-sucking operation is repeated again.

Next, the ball-adsorbing head 13 is transported to the bonding stage 4 by means of the substrate-transporting mechanism 2. At this time, balls B should not fall down due to vibration during transportation, etc.

Then, as shown in FIG. 3, the transported ball-adsorbing head 13 is turned over and fixed on a bonding stage 4, which is used also as a device holding stage and fixed by vacuum suction. The balls B, which are held on the ball-arranging substrate 15 of the ball-sucking head 13 settled on the bonding stage 4, are aligned with the innerlead 20 of a film carrier. Such an alignment may be carried out by an alignment mechanism of the main apparatus. After the alignment is settled, balls B are bonded (transferred) to the innerlead 20 by means of the transferring mechanism of the innerlead bonder itself.

Figure 4:
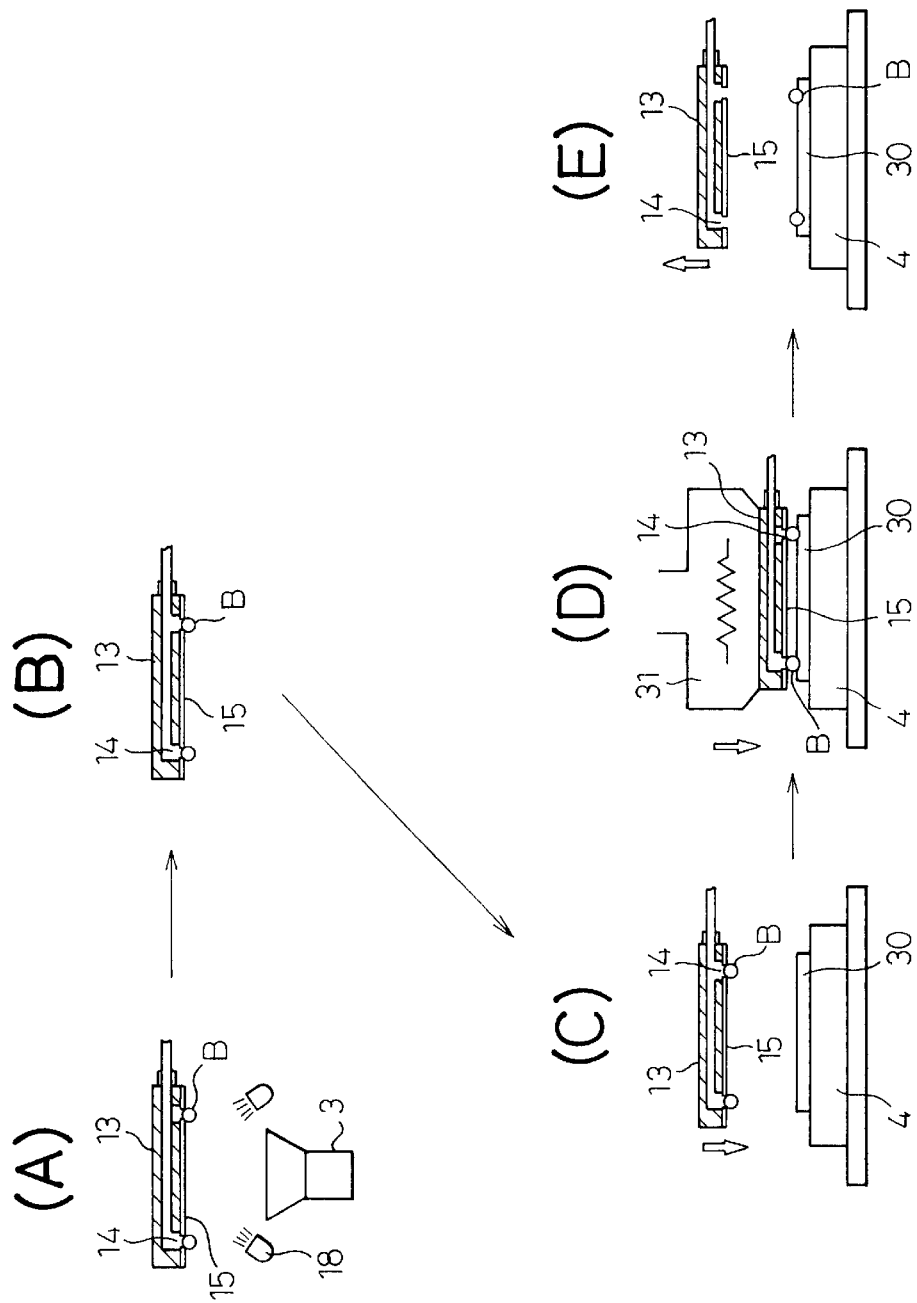
FIG. 4 is a schematic diagram for bonding balls to electrode pads of a semiconductor chip.

Alternately, as shown in FIG. 4, when the balls B are bonded to the electrode pads of a semiconductor chip, the semiconductor chip 30 is mounted on the bonding stage 4. Then, the ball-sucking head 13 is lowered without being turned over, and the balls B are contacted with and bonded to the electrode pads of the semiconductor chip 30, while the ball-sucking head 13 is heated by means of a heating tool 31.

In the above, the present invention is described referring to the preferred embodiments for forming bumps by means of the ball-arranging substrate. However, it is to be noted that the present invention should not be limited solely to these embodiments.

Nextly, as an embodiment of the present invention, an example of a ball-arranging head comprising a ball-arranging substrate of glass will be described.

Figure 5:
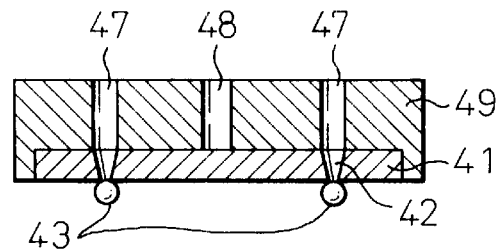
FIG. 5 is a cross-sectional view of an example of a ball-arranging head.

As shown in FIG. 5, a ball-arranging glass substrate 41 is fixed to a arranging substrate-holding jig of stainless steel 49 by evacuating its vacuum space 48 for sucking an arranging substrate 41. For example, a number of minute balls 43 of 60 $\mu$m in diameter which are composed of mainly gold, are sucked and held by evacuating the ball-sucking vacuum spaces 47 which are provided in the jig 49 for fixing the ball-arranging substrate 41.

The ball-arranging substrate 41 has ball-arranging holes 42 of e.g., 30 $\mu$m, in diameter, i.e., a half of that of the balls.

The balls 43 are held in the ball-arranging holes 42 by evacuating the ball-sucking vacuum spaces 47 formed in the jig 49, from the rear surface of the ball-arranging substrate 41.

Although the arranging substrate 41 is evacuated by evacuating the arranging substrate-sucking vacuum space 48 in this example, it is possible to apply a unified type ball-sucking and transferring head, in which the ball-arranging substrate 41 is fixed on the jig 49, while the substrate-adsorbing vacuum spaces 48 are omitted.

In addition, the jig 49 for fixing an arranging substrate of the present invention may be provided with a heating mechanism, allowing bonding the balls by heating the balls.

If the ball-sucking vacuum space provided in the jig for fixing an arranging substrate is too large, and the contact area of an arranging substrate with the substrate-fixing jig around the balls is too small, the ball-arranging substrate may not withstand the bonding pressure. In order to eliminate such a break, it is preferable to form the ball-sucking vacuum spaces 47 as ditches or grooves having a width of 10 to 100 times as large as the diameter of the ball-arranging holes 42.

Figure 6A:
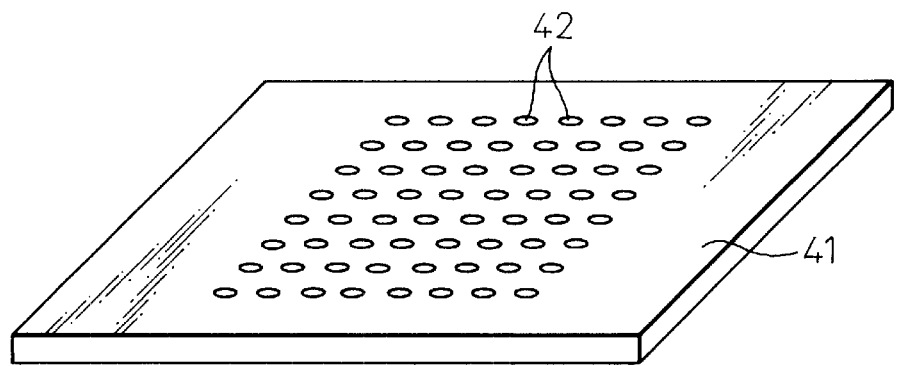
FIG. 6A is a perspective view of a minute electroconductive ball-arranging substrate for illustrating an example of holes arranged in the form of a grid.
Figure 6B:
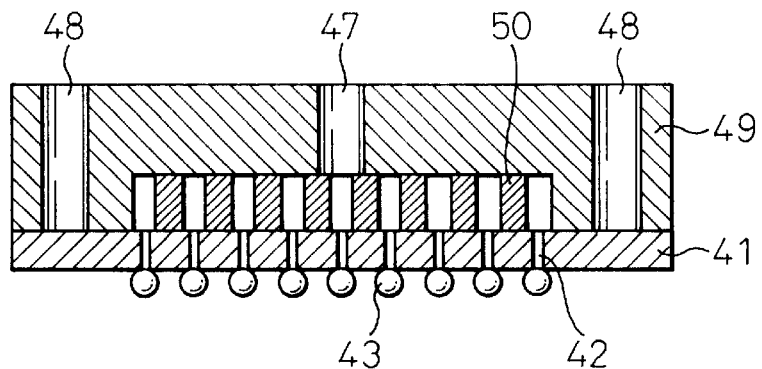
FIG. 6B is a sectional view for illustrating said ball-arranging substrate and a jig for fixing the substrate.
Figure 7A:
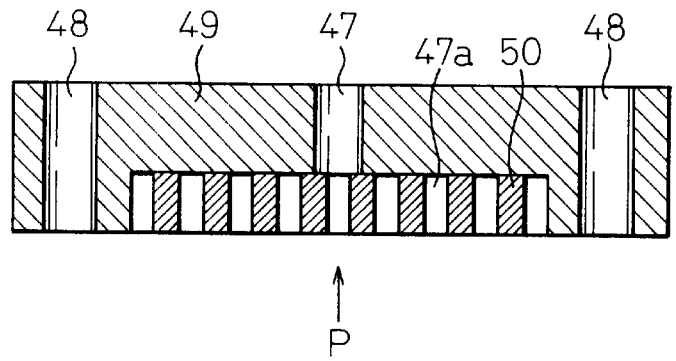
FIG. 7A is a sectional view of a minute electroconductive ball-arranging jig for illustrating an example of ball-sucking holes arranged in the form of a grit.
Figure 7B:
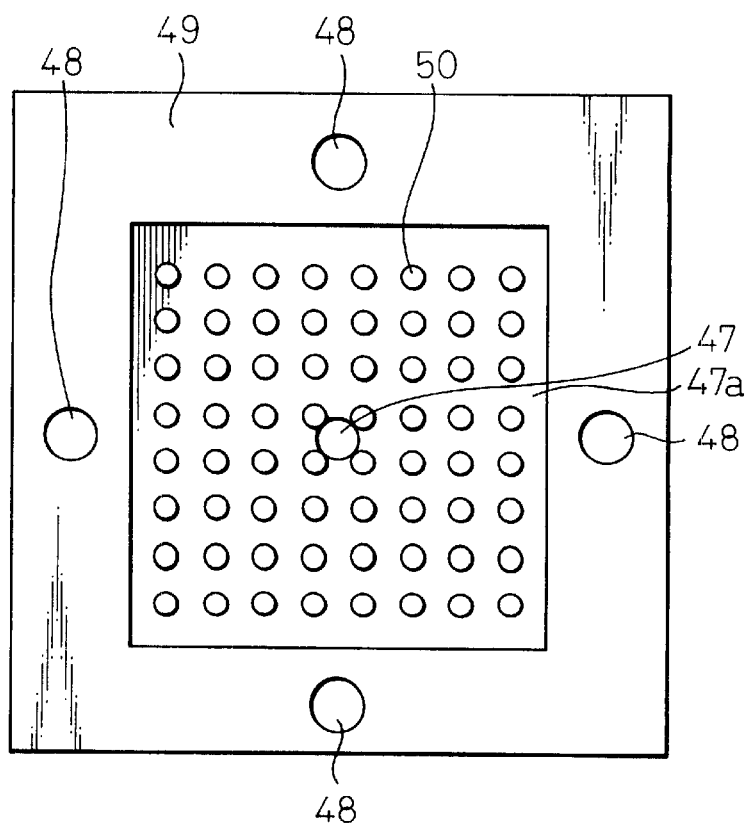
FIG. 7B is a view taken along arrow P in FIG. 7A.

However, where the balls are sucked and arranged in the ball-arranging holes 42, which are arranged in the form of a grid, in the ball-arranging substrate 41 as shown in FIGS. 6A and 6B, it is necessary to provide extruding pillars 50 in order to increase the contact area between the substrate-fixing jig 49 and the ball-arranging substrate 41, as shown in FIGS. 7A and 7B. In order to provide such a contact area, as in other examples, it may be possible to apply a porous material to the ball-sucking vacuum space 47a or to a substrate-fixing jig 49 itself.

Turning to the process for bonding balls as shown in FIGS. 1 to 4, an image-recognizing method is used in the inspecting step after the sucking of minute electroconductive balls, which are sucked and held on the ball-arranging surface of a ball-arranging substrate in the locations corresponding to those of the electrodes of a semiconductor device or a printed circuit board. Such an image-recognizing method comprises the steps of illuminating the ball-arranging substrate and the minute balls sucked and held thereon, and optically examining their reflected light by means of a CCD camera.

Figure 8:
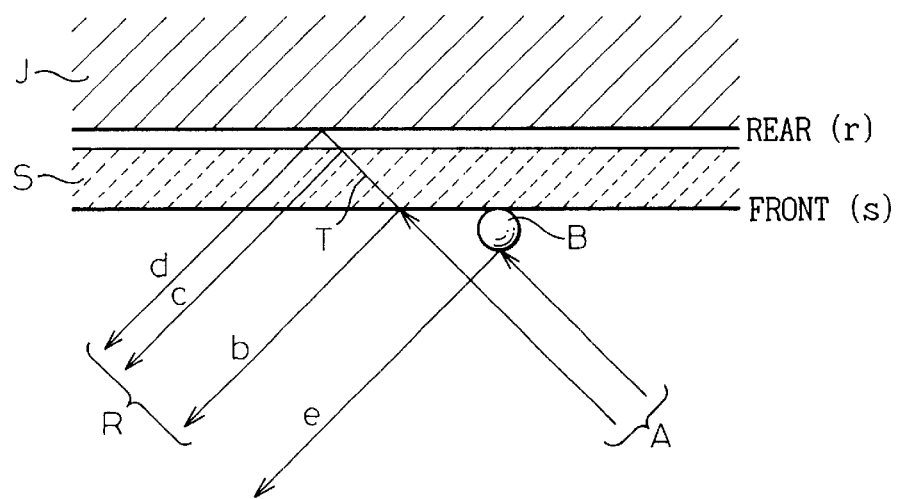
FIG. 8 is a sectional view for illustrating the light reflection of the ball-arranging substrate according to the invention.

The reflectivity of a ball-arranging substrate according to the invention is meant by the ratio of the entire reflected light R to the incident light A, where the entire reflected light contains light b reflected by the front surface s of the ball-arranging substrate S, light c reflected by the rear surface r of the ball-arranging substrate S and light d reflected by the substrate-fixing jig J located on the rear surfacer of the ball-arranging substrate S, as shown in FIG. 8, in which B and T are designated for the minute balls and the transmitted light, respectively.

When the light reflected solely by the substrate is measured, light d reflected by the jig J does not exist. Therefore, in such a case the reflected light is measured by placing a reflective mirror on the rear surface of the substrate.

The present invention resides in improving the accuracy of recognizing the conditions of arrangement of the sucked minute balls, whereby decreasing the reflectivity of the ball-arranging substrate, as set forth above, down to not more than 50%.

Figure 9A:
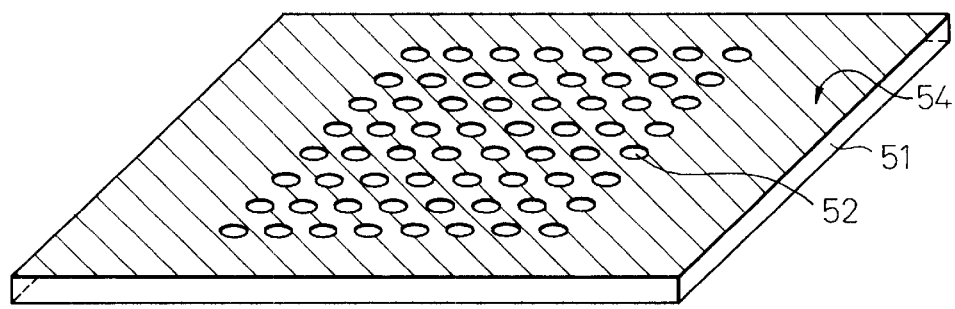
FIGS. 9A and 9B are a perspective view and a sectional view of the substrate, respectively, for illustrating an example of the ball-arranging substrate.
Figure 9B:
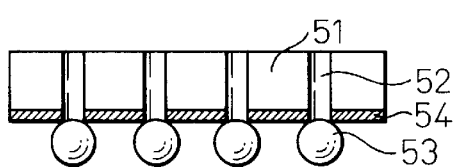

According to a preferred embodiment of the present invention, as shown in FIGS. 9A and 9B, the ball-arranging substrate 51 is provided with ball-arranging holes 52 each located in the locations corresponding to those of the electrodes of a semiconductor device or a printed circuit board, and thus minute electroconductive balls 53 are sucked and held on the ball-arranging surface, wherein an anti-reflection film, preferably made of a coating film 54 as described later, is formed on the ball-arranging surface of the ball-arranging substrate 51.

When a xenon lamp is used as a recognizing light source, the amount of light reflected by the ball-arranging substrate 51 is made to be not more than 50%, preferably not more than 30%. It is possible to recognize the image more exactly, while the contrast between the minute electroconductive balls 53 and the ball-arranging substrate 51 is made more clearly, by reducing the amount of light reflected by the ball-arranging substrate 51.

Figure 10A:
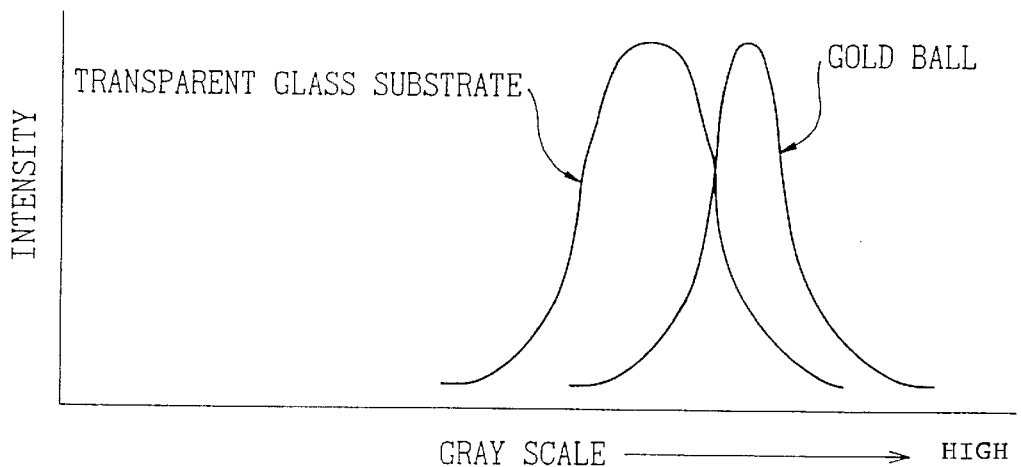
FIG. 10A is a diagram for illustrating the distribution of light reflected by a minute ball and a ball-arranging substrate.

According to the image recognizing method, the image taken by a CCD camera is generally depicted on a gray scale image picture 256 tones corresponding to the amount of the incident light. A threshold value is predetermined among the 256 tones, and the binary image (white or black) is judged using the threshold value. FIG. 10A illustrates an example of the distributions of the amount of light reflected by the minute balls and the ball-arranging substrate. When the distributions of the reflected lights overlap as in this example, it is difficult to discriminate the minute balls from the ball-arranging substrate by means of the binary image method.

Figure 10B:
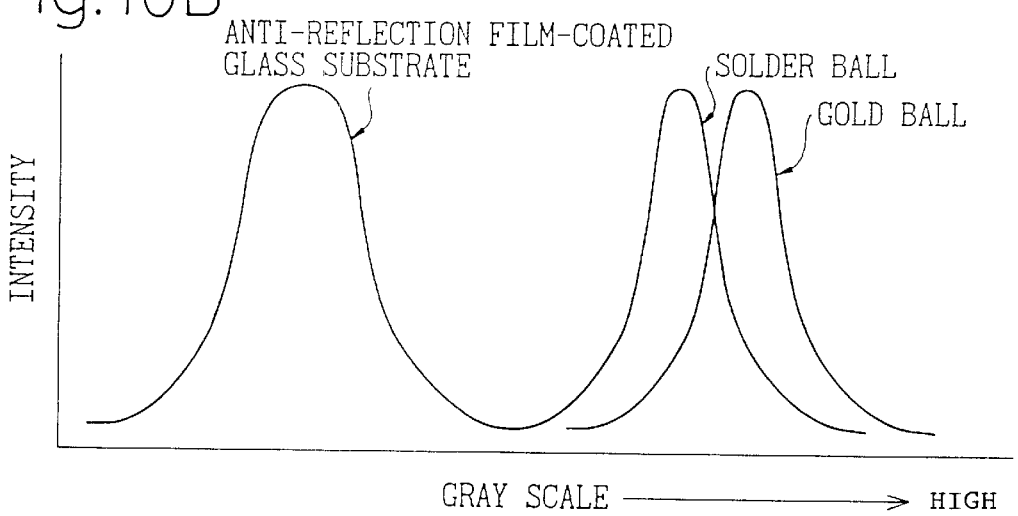
FIG. 10B is a diagram for illustrating the distribution of light reflected by minute balls and a ball-arranging substrate.

As shown in FIG. 10B, it is possible to exactly discriminate the minute balls 53 from the ball-arranging substrate 51 by the binary image method, owing to the difference in the amount of reflected light therebetween, by using the ball-arranging substrate 51 according to the present invention. The reflectivity of the coated ball-arranging substrate 51, as shown in FIG. 10A, is about 25 to 30% in the entire range of wave length of the incident light of 400 to 800 nm. Although the degree of tone of light reflected by the minute balls may fluctuate due to the deviation in the material and the surface condition of the minute balls 53, it is possible to discriminate the balls from the substrate irrespective of the conditions of the minute balls 53, when the ball-arranging substrate 51 according to the present invention is used. Particularly, when the reflectivity of the ball-arranging substrate 51 is more than 50%, minute balls 53 may have such a value of the reflectivity depending on their surface conditions, and thus it may be difficult to distinguish them from each other.

In order to decrease the reflectivity of the ball-arranging substrate, it is possible to use a black material 51 itself, or rather simply a common substrate, the surface of which is coated with a nearly black film 54 to reduce its cost. The term "nearly black" means riot to be strictly black, but any color which is capable of depressing the reflection of light, e.g., dark brown or deep blue when a white light is used. The process for coating the substrate may be effected by sputtering, vacuum evaporation, ion plating, chemical vapor deposition, plating or painting. Any material capable of reducing reflection may be used as a coating film, for example, oxides ($W_2O_3$, $Fe_2O_3$, chromium oxide, etc.), nitrides (SiN, TiN, etc.), carbides (SiC, TiC, etc.).

Also, oxides which exhibit a complicating crystal structure, such as perovskite, or even an amorphous structure may be used. The coating may utilize multi-reflection by a multilayered structure, or may be formed by coating and drying a solution containing a nearly black powder. A transparent film (e.g., $SiO_2$), may be laminated on the coating to form a sandwiched structure having such a dark colored layer therebetween. The thickness of the coating film has been checked in the range of 0.05 to 100 μm. When a transparent glass is used as the ball-arranging substrate 51, the jig for holding the ball-arranging substrate also reflects light. Such a reflection can be prevented by coating the surface of the ball-arranging substrate.

In the prior art, a metallic ball-arranging substrate may cause displacement between the electrodes and the arranging holes due to a large difference in thermal expansion coefficient between the substrate and a silicon chip, etc., when they are bonded at elevated temperature. Contrary to this, when the substrate is made of a glass, which has a lower thermal expansion coefficient than a metal, it is possible to achieve ball-bonding with an improved accuracy even at a high temperature and thus to effectively adapt to the recent requirement, i.e., decreasing in the size of balls and also the pitch between the arranged electrodes. The photosensitive glass is superior to the common glass for forming minute ball-arranging holes in a more accurate manner, and thus it is possible to form fine ball-arranging holes with true hole shape and thus reduce the amount of light reflected by the edge of the holes, and to improve the accuracy of mounting the minute balls on a chip, etc.

The light applied for recognizing the image may be incident in a direction either vertical or oblique to the minute balls. As a light receptor, one or more (either black and white or colored) CCD cameras and also a line sensor, etc. may be used.

It is possible to reduce the amount of reflected light from the surface of a ball-arranging substrate by forming minute roughness on the surface of a substrate by means of sandblasting, etc.

The ball-arranging substrate according to the present invention may be applied not only to arrange gold or solder balls on a chip, but also to arrange gold or solder balls on the electrodes of a film-carrier of the so-called TAB, etc., or to arrange such balls on the electrodes of a printed circuit board, etc. It is possible to form ball-bumps with a very high accuracy, when a ball-arranging substrate according to the present invention is combined with a head containing a holding means which is provided with a vacuum space for holding the ball-arranging substrate and the minute balls on the side opposite to the surface for holding the ball-arranging substrate. It is also advantageous for recognizing the image to use a ball-arranging black substrate, also in a method for holding minute balls other than suction.

As a preferable embodiment of the present invention, the ball-arranging substrate is made of a glass. Particularly by using a glass whose thermal expansion coefficient is lower than that of a metal such as stainless steel and nearly equal to that of silicon, it is possible to reduce the misalignment between the minute electroconductive ball and the electrode portion even when thermo-compression bonding is effected at a high temperature.

When a minute ball may happen to thrust into an opening of the ball-arranging substrate due to the high pressure bonding, it is easy to remove such a ball by immersing the glass substrate into an acid or alkaline solution which dissolves the metal. Contrary to this, when a ball-arranging substrate is made of a metal, it is difficult to completely remove the minute ball thrust into an opening, because the metallic substrate itself may be dissolved into above solutions.

When the thermal expansion coefficient of a ball-arranging substrate made of a glass is in a range of (1 to 100)×10$^{-7}$/° C., preferably in the range of (20 to 90)×10$^{-7}$/° C., i.e., from about 40×10$^{-7}$/° C. of the coefficient of silicon to the twice thereof, it is possible to considerably reduce the occurrence of misalignment in comparison with the case of a ball-arranging metallic substrate. Furthermore, a photosensitive glass is capable of forming minute holes superior in their shape and in precise locations, and thus it is possible to form ball bumps with a fine pitch (not more than 300 μm, particularly not more than 100 μm) without occurrence of displacement.

In addition, it is possible to at once open all the holes by exposing a photosensitive glass through a mask, and thus to produce a ball-arranging substrate at a very low cost. Such an advantage is particularly evident in the production of a ball-arranging substrate having not less than 100 holes (particularly, not less than 300 holes) all at once. Contrary to this, when the holes are opened one by one, e.g., by means of electric discharge working, if forming a ball at only one hole is failed, it is necessary to repeat the whole opening operations, and thus the yield of the substrate is reduced. In addition, it is possible to easily form alignment marks in optional numbers at optional locations, which marks can be used to aligning the electrode portion for forming bumps.

A photosensitive glass, which is capable of being applied to the production of a ball-arranging substrate according to the present invention, may be $SiO_2$—$Al_2O_3$—$LiO$ based glass containing Ag, Au, Cu, etc. as a photosensitive metal. If necessary, it is possible to add $CeO_2$, etc. as a photosensitizating agent. After the both surfaces of the photosensitive glass plate are polished, a mask, in which a pattern of holes is provided in appropriate location corresponding to those of the electrodes of a semiconductor device, etc., is placed on a surface of a polished glass plate. Then, the surface is irradiated by ultraviolet rays to expose opening portions of glass. After the mask is removed, an appropriate thermal treatment is effected to crystallize the irradiated portions of the glass, which are then dissolved by means of an acid to form the desired ball-arranging holes.

It is possible to form bumps with an accuracy of not more than ±5 μm, preferably not more than ±3 μm, from the centers of the balls and the centers of corresponding Al electrode pads, etc. on a semiconductor device, by using the ball-arranging substrate according to the present invention which has the holes with an accuracy of the location of not more than ±5 μm, preferably not more than ±3 μm.

In the process set forth above, the holes are opened in a glass substrate where the exposed portions are liable to be etched by an acid, it is also possible to open the similar holes by selecting a photosensitive glass, in which the portions irradiated by ultraviolet rays are difficult to etch with an acid.

This ball-arranging substrate may be used in combination with a head, which can apply a pressure or heat at the time of arranging the balls. In such a case, a certain thickness of the ball-arranging substrate is necessary to exhibit a strength, which is bearable to the pressure effected in the bonding operation. However, in the case of thick glass it is difficult to etch glass by acid, etc. The present inventors found that a thickness of 0.1 to 1.0 mm is appropriate to open uniform holes, after investigating ball-arranging substrates having various thicknesses.

Although the thickness of a glass substrate is limited as set forth above, 10% of the ball-arranging glass substrates suffered from cracking at an applied 5 kg force for bonding when the thickness is less than 0.25 mm. Contrary to this, substrates of 0.3 mm in thickness did not suffer from cracking even after 10,000 operations, bonding, and thus they can be successfully used in production. On the other hand, a glass substrate, whose thickness is not less than 1 mm, exhibits disadvantages, i.e., when the glass substrate is etched to open the holes, the etching time increased and it was difficult to uniformly form the diameter of the opened holes over a prolonged etching time. Therefore, it was clear that the thickness of a ball-arranging glass substrate should preferably be not thinner than 0.3 mm and not thicker than 1.0 mm, according to the present invention.

In order to apply minute balls to the ball-arranging substrate, it was necessary to optimize not only its thickness but also the diameter of the holes for sucking and holding the balls, by various experiments. That the diameter of the arranging holes is simply smaller than that of the minute electroconductive balls is not sufficient to successively execute the ball-arranging operation by means of suction or evacuation. If the ratio of the diameter of the holes to that of the balls is less than 1/3, the efficiency of suction decreases. According to the inventor's experiments, for example, the percent ratio of success in holding by sucking 500 minute solder balls of 80 μm in diameter was 80 to 87%, when the diameter of the holes in the ball-arranging substrate was not more than 20 μm. Contrarily to them, the percent ratio of success was not less than 95%, when the diameter of the holes was set to not less than 25 μm.

In addition, it was clarified after the inventor's detailed experiments that the minute balls thrust into the holes by the pressure effected by transferring the minute balls on the electrodes, when the ratio of the diameter of the ball-arranging holes to that of the minute electroconductive balls exceeds 4/5. For example, when 300 gold balls 40 μm in diameter were held on a ball-arranging substrate having holes 34 μm in diameter and the balls were pressed on the substrate with a pressure of 20 g/ball, 52 balls among 300 balls were thrust into the holes of the ball-arranging substrate, and thus the ball-bonding was not completed. Contrary to this, when the diameter of the holes was set to 32 μm and the other condition was the same as in the experiment set forth above, no ball thrust occurred. Therefore, it was first clarified according to the present invention that the ratio of the diameter of the ball-arranging holes to that of the minute electroconductive balls should be in the range of from 1/3 to 4/5. In the case of a metallic substrate, e.g. of stainless steel, such a relationship between the diameters of the holes of the substrate and the minute balls was not clearly observed because the edge of the holes was swollen when the holes were formed by electric discharge working.

It is appropriate that the preferable ball-arranging glass substrate is used by coating an anti-reflection film and thus decreasing the reflectivity down to not more than 50% as set forth above. However, it should be noted that the limitations of the diameter of the holes and the thickness of the ball-arranging substrate themselves are characteristic factors of the present invention and constitute an independent invention.

Figure 11A:
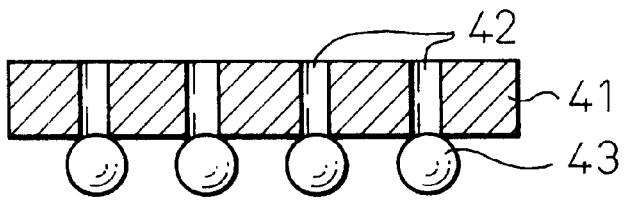
FIGS. 11A to 11F illustrate cross-sectional views of a ball-arranging substrates having various type of ball-arranging holes.
Figure 11B:
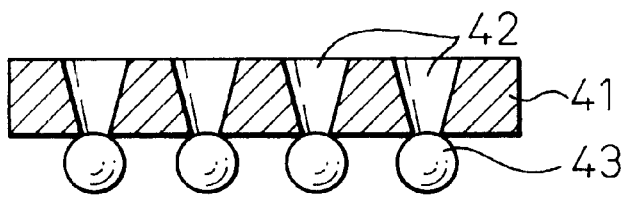
Figure 11C:
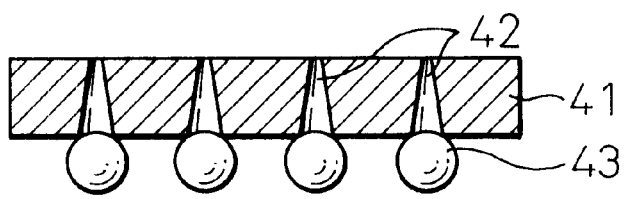
Figure 11D:
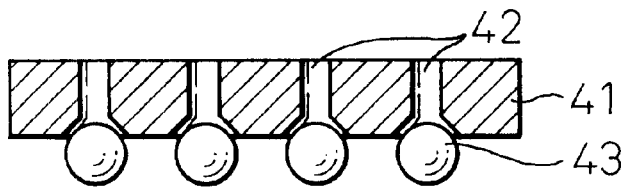
Figure 11E:
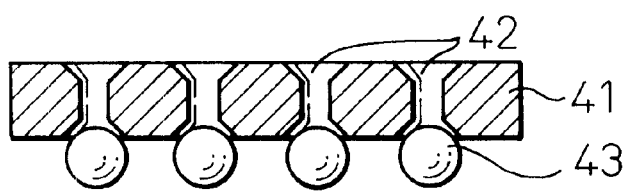
Figure 11F:
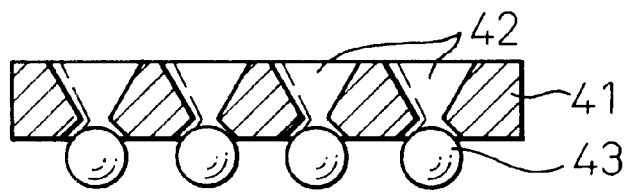

Several examples of the form of holes opened in the substrate are shown in FIGS. 11A to 11F. In the drawings, the surface for use in arranging the balls is defined as the front surface. FIG. 11A illustrates a substrate where the diameter of a hole is the same on the front and rear surfaces. In FIG. 11B, the diameter of a hole is smaller on the front surface than on the rear surface. In FIG. 11C, the size of the diameter of a hole is larger on the front surface than the rear surface reversely to FIG. 11B. FIG. 11D illustrates a substrate as shown in FIG. 11A, which was machined to have larger diameter on the front surface and the edge around the hole near to the front surface was cut off. In FIG. 11E, the substrate shown in FIG. 11D was further machined to have the edge near to the rear surface was cut off. FIG. 11F illustrates a substrate having a mixed type of FIG. 11B and FIG. 11C, in which the diameter of a hole is larger near to the both surfaces and grows smaller toward inside the substrate.

The ball-arranging substrate shown in FIG. 11B is advantageous in preparing the suction system, because the diameter of the holes is larger on the reduced pressure side than in the ball-sucking surface (it is necessary to prepare a groove pattern for providing vacuum in a ball-arranging head in the locations for holding the substrate corresponding to the locations of the holes of the arranging-substrate. If the diameter and the pitch of the holes are narrow, it is difficult to prepare such a groove pattern).

In the preparation of the substrates as shown in FIGS. 11D, 11E and 11F, the ball-arranging holes can be worked by means of either acid etching or mechanical polishing. And the edge of the holes may be either linearly tapered or smoothly curved. In FIGS. 11E and 11F, the diameters of the holes may be equal to or different from each other on the front and rear surface sides, however it is desirable that the minimum diameter of the hole, where the minute balls on the front surface are sucked and held, is in the range of 1/3 to 4/5 of the diameter of the minute ball.

The ball-arranging substrate according to the present invention may be applied to arrange gold or solder balls on the electrodes of a film carrier, e.g., TAB, etc., and to arrange such balls on the electrode of a printed circuit board, other than the arrangement of such balls on a chip as detailed in the Example set forth below. It is possible to prepare extraordinarily precise ball bumps, by using a head in which a ball-arranging substrate made of glass according to the present invention is combined with a means for holding the ball-arranging substrate and the minute electroconductive balls provided with a vacuum space on the side opposite to the side of holding the balls.

EXAMPLES

An example, to examine errors in sucking minute balls by means of a ball-arranging substrate according to the present invention, will be described.

Ball-arranging glass substrates, each coated with a coating film of $W_2O_5$, $Fe_2O_3$, TiN or TiC, were prepared. A so-called image-recognition test by means of a CCD camera was effected on these substrates, on the surface of which minute electroconductive balls were sucked. Table 1 also shows the results using a bare glass substrate.

TABLE 1

| Coating film | Result |
| --- | --- |
| No film (comparative) | x |
| $W_2O_5$ | ○ |
| $Fe_2O_3$ | ○ |
| TiN | ○ |
| TiC | ○ |
| Chromium oxide | ○ |
| Perovskite structure oxide (Y—Ba—Cu—O) | ○ |

The errors in the minute electroconductive ball-adsorption were examined by the image-recognition test under the following conditions:

Ball-arranging substrate=photosensitive glass

Number of the sucking holes of the substrate: 300

The diameter of the sucking balls (μm): 30, 60, 100, 150, 200, 300 and 500
The material of the sucked balls:
Gold and solder
Light source: Xenon lamp
Substrate with no coating (Comparative): reflectivity of 10 to 15%, transmissivity of 85 to 90%
Substrate with a coating:
reflectivity of 5 to 40%, transmissivity of 3 to 20%
Number of Experiments: 100

In the Table, the mark × shows the case in that sucking more or less minute balls was judged as proper or appropriate sucking was judged as failure, and the marks o show that recognition of existence of excess balls and holes lacking sucked balls could be exactly done. It is clear from the results that when the image recognition is made using a glass substrate with no coating, even excess or lacking of minute balls are judged as correct and that the number of sucked minute balls was exactly judged in the cases of the coated glass substrates, in which the five coating films depressed the light reflection from the surface of the ball-arranging substrate. The erroneous recognition occurred at a rate of 15% in average for the bare substrate.

It is possible to exactly produce bumps on the minute ball-arranging substrate according to the present invention, even if the diameter of the balls and the pitch of arranging balls are modified due to the future trend of semiconductor devices.

Thus, according to the present invention, it is possible to form precisely minute electroconductive bumps on the electrodes of a semiconductor chip, a film-carrier or a printed circuit board, because the light reflected by the surface of a ball-arranging substrate is depressed and thus the accuracy of image recognition is extraordinarily improved in the inspection of the minute balls sucked on the ball-arranging substrate.

A ball-arranging head as shown in FIG. 5 was used to produce minute electroconductive ball bumps.

Figure 12A:
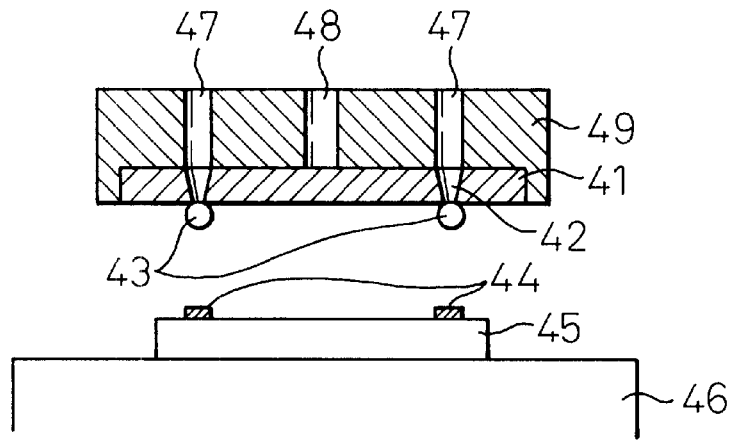
FIGS. 12A to 12C are a series of sectional views, illustrating a process for producing minute electroconductive ball bumps using a ball-arranging glass substrate.

Referring to FIG. 12A, a ball-arranging substrate 41 is moved over a semiconductor chip 45 and the locations of the balls 43 and the electrode pads 44 are aligned. A rapid alignment can be done by using the alignment marks formed on the ball-arranging substrate 41.

Figure 12B:
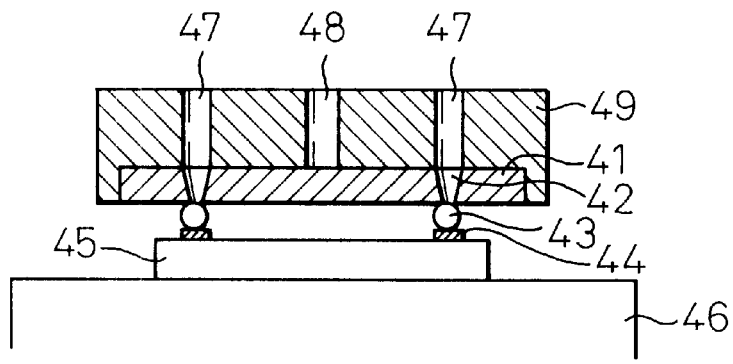

As shown in FIG. 12B, the balls 43 held by the substrate are lowered and pressed down onto the pads 44 of the semiconductor chip 45 mounted on the support 46 with a pressure of 10 to 30 gf per one ball.

Figure 12C:
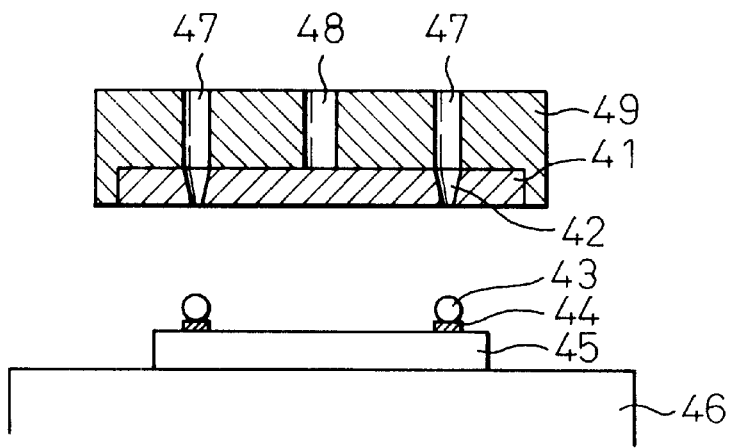

As shown in FIG. 12C, all the balls 43 are bonded to the pads 44, and then the reduced pressure space 47 for sucking the balls is pressurized to atmospheric pressure, and the ball-arranging substrate 1 is moved upwards.

In this example in which the minute electroconductive balls 43 are sucked and held on the substrate 41, no lack of balls occurs or no excess balls are sucked due to the lack of suction or the leak of air generated by an inappropriate shape of the holes. The semiconductor chip 45 provided on its support 46 is heated up to 300 to 500° C. The bumps are bonded to the electrodes while forming an Al—Au-based alloy, without failure. The displacement of the bonded gold balls due to the influence of the heat at the time of forming bumps was not more than ±3 μm. The deviation of the height of bumps was not more than ±2 μm. Furthermore, when a thus bump-provided semiconductor chip was transported, no bumps fell off. In addition, when such a bump-provided semiconductor chip 45 was bonded to an innerlead of a film-carrier, it was confirmed that the leads did not flow and fall off.

On the other hand, when ball-bumps were formed by means of a ball-arranging stainless steel substrate, in which ball-arranging holes were formed by means of electrical discharge working, the displacement of the formed bumps was more than ±10 μm, while the other conditions were the same as those set forth above, and the deviation of the height of the formed bumps was in the range of ±7 μm.

As illustrated in the above experiment, in a minute electroconductive ball-arranging substrate or a minute electroconductive ball-arranging head, by using a glass substrate, and by improving the precision of the location and the shape of the ball-arranging holes, it was possible to extraordinarily improve the accuracy in setting the ball-arranging location, which allows forming minute electroconductive bumps with a high accuracy on the electrodes of a semiconductor chip, a film-carrier or a printed circuit board.

What is claimed is:

1. A ball-arranging substrate comprising:
   a substrate having a main surface; and
   a plurality of ball-arranging holes which are provided on said main surface at locations corresponding to those of electrodes of a semiconductor device or a printed circuit board, etc., to suck and hold minute electroconductive balls in said ball-arranging holes;
   wherein when light illuminates said ball-arranging surface, the conditions of arrangement of said minute electroconductive balls are optically recognized by means of the light reflected by said minute electroconductive balls and by said ball-arranged surface, the wave length of the light of a light source is set in the range of 300 to 900 nm, and the reflectivity of light from the light source is made not more than 50%, provided that a reflective mirror is arranged on the rear surface of said ball-arranging substrate opposite to said light source, in the case when said ball-arranging substrate is transparent to the irradiated light.

2. A ball-arranging substrate according to claim 1, wherein a reflection-reducing film is formed on said ball-arranging surface on which said minute electroconductive balls are sucked and held.

3. A ball-arranging substrate according to claim 1, wherein said ball-arranging substrate is made of glass.

4. A ball-arranging substrate according to claim 3, wherein said substrate is made of a photosensitive glass.

5. A ball-arranging substrate according to claim 1, wherein the ratio of the diameter of said ball-arranging holes on said ball-arranging surface to the diameter of said minute electroconductive balls is in the range of from 1/3 to 4/5, and
   the thickness of said ball-arranging substrate is in the range of from 0.3 to 1.0 mm.

6. A ball-arranging substrate according claim 1, wherein the diameter of said minute electroconductive ball is in the range of 20 to 300 μm.

7. A ball-arranging substrate according to claim 1, wherein said reflectivity of said ball-arranging substrate is not more than 30%.

8. A minute electroconductive ball-arranging head, comprising:
   a minute electroconductive ball-arranging substrate claimed in claim 1; and,
   a means for holding said minute electroconductive balls, provided with a vacuum space for sucking said minute electroconductive balls on the surface of said substrate opposite to the surface, for holding said minute electroconductive balls.

9. A minute electroconductive ball-arranging apparatus, comprising:
- a minute electroconductive ball-arranging head claimed in claim 8;
- a light source for illuminating a surface of said substrate on which said minute electroconductive balls are held;
- a light-receiver for receiving light from said light source after it is reflected by said substrate; and,
- an image-recognizing and treating means for recognizing the conditions of the arrangement of said minute electroconductive balls, which are arranged on said substrate, based on the output from said light-receiver, said image-recognizing and treating means examining the conditions of the arrangement of the electroconductive balls after said electroconductive balls are arranged on said ball arranging substrate.

10. An apparatus for arranging minute electroconductive balls according to claim 9, wherein arranging of said minute electroconductive balls is repeated on said minute electroconductive ball-arranging substrate is repeated, in the case when the conditions of arrangement of said minute electroconductive balls are not appropriate.

11. A method for arranging minute electroconductive balls according to claim 8,
wherein said ball-arranging substrate is one in accordance with any one of claims 1 to 9.

12. A minute electroconductive ball-arranging substrate made of glass comprising a plurality of ball-arranging holes, the diameter of which is smaller than that of said minute electroconductive balls, to arrange said minute electroconductive balls at locations corresponding to those of electrodes of a semiconductor device or a printed circuit board,
- wherein the ratio of the diameter of said ball-arranging holes to that of said minute electroconductive balls is in the range of from 1/3 to 4/5, the diameter of said ball-arranging holes being measured on the side of arranging said minute electroconductive balls of said ball-arranging substrate; and
- the thickness of said minute electroconductive ball-arranging substrate is in the range of from 0.3 to 1.0 mm.

13. A minute electroconductive ball-arranging glass substrate according to claim 12,
wherein said substrate is made of a photosensitives glass.

14. A minute electroconductive ball-arranging head, comprising:
- a minute electroconductive ball-arranging substrate claimed in claim 12; and,
- a means for holding said minute electroconductive balls, provided with a vacuum space for sucking said minute electroconductive balls on the surface of said substrate opposite to the surface, for holding said minute electroconductive balls.

15. A minute electroconductive ball-arranging apparatus, comprising:
- a minute electroconductive ball-arranging head claimed in claim 14;
- a light source for illuminating a surface of said substrate on which said minute electroconductive balls are held;
- a light-receiver for receiving light from said light source after it is reflected by said substrate; and,
- an image-recognizing and treating means for recognizing the conditions of the arrangement of said minute electroconductive balls, which are arranged on said substrate, based on the output from said light-receiver, said image-recognizing and treating means examining the conditions of the arrangement of the electroconductive balls after said electroconductive balls are arranged on said ball arranging substrate.

16. An apparatus for arranging minute electroconductive balls according to claim 15, wherein arranging of said minute electroconductive balls is repeated on said minute electroconductive ball-arranging substrate is repeated, in the case when the conditions of arrangement of said minute electroconductive balls are not appropriate.

17. A method for arranging minute electroconductive balls, comprising the steps of:
- sucking and holding to arrange minute electroconductive balls on a surface of a minute electroconductive ball-arranging substrate, at locations corresponding to the locations of electrodes of a semiconductor device or a printed circuit board; and
- illuminating said surface holding said minute electroconductive balls to recognize the conditions of arrangement of said minute electroconductive balls by using the light reflected by said minute electroconductive balls and that reflected by said minute electroconductive ball-arranging surface,
- wherein the wave length of said illuminating light is set in the range of 300 to 900 nm, and the reflectivity of the light reflected by said minute electroconductive ball-arranging surface, is set to be not more than 50% based on the light source.

* * * * *